United States Patent [19]

Ahmed

[11] 3,873,853

[45] Mar. 25, 1975

[54] COMPARATOR-KEYED OSCILLATOR

[75] Inventor: Adel Abdel Aziz Ahmed, Annandale, N.J.

[73] Assignee: RCA Corporation, New York, N.Y.

[22] Filed: Aug. 9, 1973

[21] Appl. No.: 387,170

[52] U.S. Cl. ....... 307/235 R, 307/252 B, 307/252 J

[51] Int. Cl. .............................................. H03k 5/20

[58] Field of Search ......... 307/235 R, 252 B, 252 J, 307/252 N

[56] References Cited

UNITED STATES PATENTS

| | | | |
|---|---|---|---|
| 3,221,183 | 11/1965 | White | 307/252 T |
| 3,543,170 | 11/1970 | Diederich | 307/235 X |
| 3,728,557 | 4/1973 | Pelly et al. | 307/252 N |

FOREIGN PATENTS OR APPLICATIONS

| | | | |
|---|---|---|---|
| 280,059 | 7/1965 | Australia | 307/235 |

*Primary Examiner*—John Zazworsky
*Attorney, Agent, or Firm*—H. Christoffersen; S. Cohen; A. L. Limberg

[57] ABSTRACT

A dead-zone comparator includes first and second voltage comparators used respectively to compare an input signal to a high reference level and to a low reference level, which reference levels can be programmed. A bistable memory element is set by the output signal of one comparator and reset by the output signal of the other. These SET and RESET signals are opposite polarity currents, one of which is more severely constrained in value than the other, and are applied via a common SET-RESET buss to the memory element. When the memory element is in its SET condition, a relaxation oscillator is permitted to deliver output pulses of sufficient magnitude to trigger SCR's or triacs directly. When the memory element is in its RESET condition, the relaxation oscillator is prevented from furnishing any output pulses.

3 Claims, 6 Drawing Figures

COMPARATOR-KEYED OSCILLATOR

The present invention relates to comparator circuits suited for construction in integrated circuit forms and for delivering output signals when applied input potentials are within programmed ranges, and particularly to those which deliver pulses suitable for the triggering of an SCR, a triac or similar triggerable switching devices.

A dead-zone comparator compares an input signal potential both to a high reference level potential and to a low reference potential, the former presumably more positive then the latter. If the input signal potential is positive with respect to the high reference level potential, the output signal of the comparator is in a first state—that is, at a first output level. If the input signal potential is negative with respect to the low reference level potential, the output signal of the comparator is in a second state—that is, at a second output level different from the first. If the input signal lies between the high and low reference potentials—that is, in the dead -zone—there is no change in the state of output signal from its prior condition. Such dead-zone is useful in making the comparator insensitive to low-level noise or spurious signals accompanying the desired components of the input signal.

To provide the dead-zone feature, a bistable memory element—such as a set-reset flip-flop employing a pair of transistors with cross-coupled collector and base electrodes—may be employed in the comparator. When the input signal potential is positive with respect to the high reference level potential, the memory element is set into its first stable state. When the input signal potential is negative with respect to the low reference level potential, the memory element is reset into its second stable state.

The type of comparator just described, incorporating a bistable memory element, is more fully described in U. S. patent application Ser. No. 320,634, filed Jan. 2, 1973, in the name of Adel Abdel Aziz Ahmed, entitled "COMPARATOR CIRCUITRY" and assigned, like the present application, to RCA Corporation.

In a comparator-keyed oscillator according to the present invention, the output signal of a basic comparator circuit is further used to determine whether or not an oscillator is to furnish oscillations for subsequent circuitry. The keyed oscillations comprise pulses having a small duty factory so that sufficient energy to trigger the largest commercially available SCR's or triacs can be provided without exceeding the permissible dissipation of an integrated circuit having included therewithin the basic comparator the bistable memory element and the oscillator. The amount of energy required for supplying recurring output pulses is sufficiently small that power supply circuits may also be included on the integrated circuit without exceeding permissible dissipation.

These keyed oscillations can be coupled via a transformer to provide triggering signals for a semiconductor controlled rectifier (an SCR), a triac or another semiconductor device which is triggered into conduction. The transformer coupling provides isolation between control circuitry (including the comparator) and power circuitry being controlled (including the triggered semiconductor device) in accordance with the safety requirements set forth by the Underwriters Laboratory. In the drawing.

Figure 1:
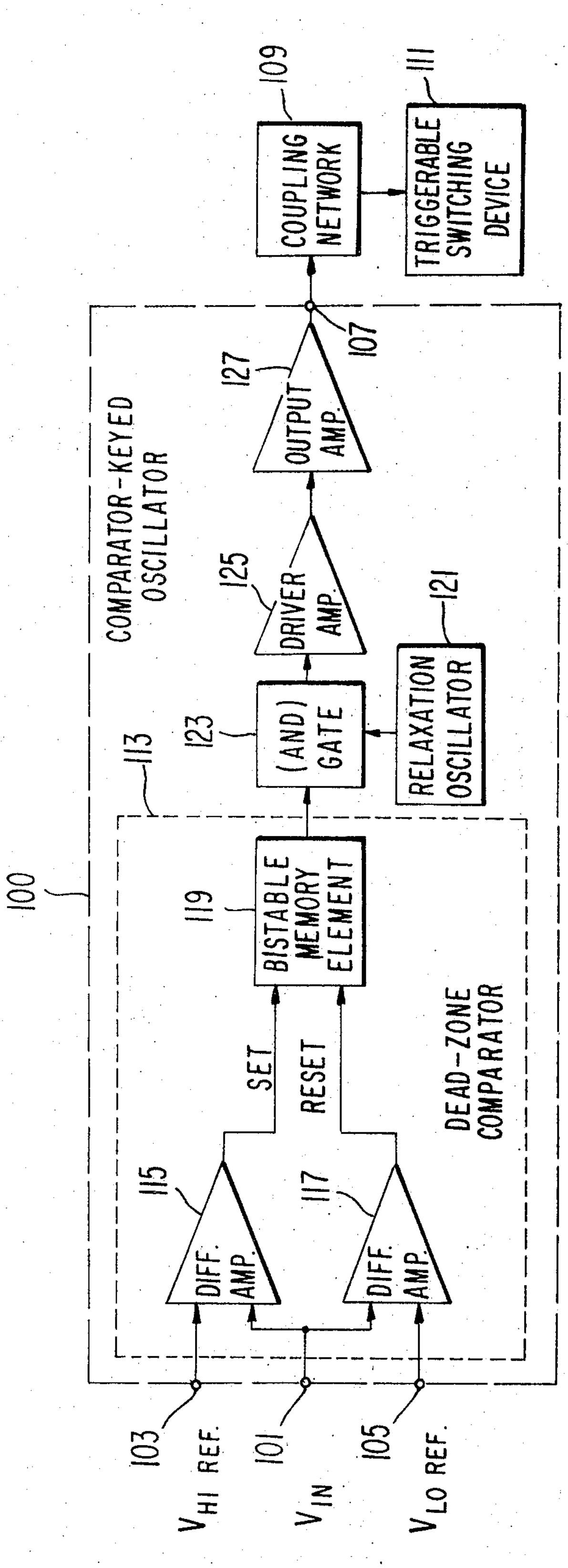
FIG. 1 is a schematic diagram of the comparator keyed oscillator sub-combination according to an aspect of the present invention, providing in accordance with another aspect of the present invention triggering signals to a subsequent triggerable semiconductor device.

In FIG. 1, an integrated comparator keyed oscillator 100 compares an input signal potential $V_{IN}$ applied to its input terminal 101 against a high reference potential $V_{HI\ REF}$ applied to its input terminal 103 and a low reference potential $V_{LO\ REF}$ applied to its input terminal 105. This comparison is for determining whether or not recurring triggering pulses are to be supplied from its output terminal 107 via a coupling network 109 to a triggerable semiconductor switching device 111. This triggerable semiconductor device 111 may be a silicon controlled rectifier (SCR) or a triac, as examples. The coupling network 109 may comprise a direct coupling or, alternatively, a transformer. Transformer coupling is readily possible between terminal 107 aand the trigger device 111 because the output signal supplied from terminal 107 under certain input signal conditions is a recurrently pulsating wave.

The comparator-keyed oscillator 100 comprises a dead-zone comparator portion 113 which includes a first and a second differential amplifiers 115 and 117, respectively, and a bistable memory element 119. Terminal 101, to which input signal $V_{IN}$ is applied, is coupled to one of the input circuits of each of the differential amplifiers 115 and 117. The differential amplifier 115 provides a SET signal to a bistable memory element 119 whenever the input signal $V_{IN}$ at terminal 101 is positive with respect to $V_{HI\ REF}$, and differential amplifier 117 provides a RESET signal to element 119 when $V_{IN}$ is negative with respect to the low reference potential $V_{LO\ REF}$ at terminal 105. The output signal of the bistable memory element 119 will be in a first state whenever $V_{IN}$ has been positive with respect to $V_{HI\ REF}$ and has not subsequently become negative with respect to the $V_{LO\ REF}$. The output signal of the bistable memory element 119 will be in a second state whenever $V_{IN}$ has been negative with respect to the $V_{LO\ REF}$ and has not subsequently been positive with respect to $V_{HI\ REF}$. Differential amplifiers 115 and 117 together with the bistable memory element 119 accordingly operate as a dead-zone comparator.

Included within the integrated comparator 100 is a relaxation oscillator 121 providing recurrent pulses. For example, pulses of 10 microsecond duration at 130 microsecond intervals may be provided from relaxation oscillator 121. AND gate 123 accepts the output signal from the bistable memory element 119 as a first input signal and pulses from the relaxation oscillator 121 as a second input signal. AND gate 123 will couple pulses from the relaxation oscillator 121 to the driver amplifier 125 when the output signal of bistable memory element 119 is in one of its stable states. However, when the output signal of the bistable memory element 119 is in the second of its stable states, the AND gate 123 does not couple pulses from oscillator 121 to the driver amplifier 125. AND gate 123 provides keyed oscillations at its output circuit, the keying being responsive to the comparator 113 providing it with an input signal. These keyed oscillations are amplified in a driver amplifier 125, then further amplified in output amplifier 127 to appear at output terminal 107 of the comparator-keyed oscillator 100.

Depending upon the way in which the bistable element 119 is connected, AND gate 123 can provide oscillations at its output circuit for either one of the following conditions and not for the other:

1. when $V_{IN}$ has been more positive than $V_{HI\ REF}$ and has not subsequently been more negative than $V_{LO\ REF}$ and 2. when $V_{IN}$ has been more negative than $V_{LO\ REF}$ and has not subsequently been more positive than $V_{HI\ Ref}$.

The remainder of the specification will more specifically treat the case where oscillations are supplied for condition (1) and not for condition (2). (The alternative case can be realized by using the output signals of differential amplifiers 115 and 117 respectively to reset and set bistable memory element 119 rather than respectively to set and reset it, for example. Since complementarily conjugate signals are normally available from the bistable memory element 119, the selection of one or the other of them for application to the input circuit of AND gate 123 will also determine which of the alternative cases obtains.)

The triggerable switching device 111 normally is used to control a signal having a fairly low frequency. For example, the controlled signal is often the 60 Hz signal from the power mains. The integrated comparator-keyed oscillator 100 functions substantially as a direct coupled voltage comparator since the first pulse appears at its output terminal 107 within the 130 microseconds interval between oscillator pulses, once $V_{IN}$ has become more positive than $V_{HI\ Ref}$. Insofar as the device 111 handling the low-frequency controlled signal is concerned, the "comparator" response is substantially instantaneous. The fact that the output signal from the comparator-keyed oscillator 100 is not a sustained output signal, but rather a train of pulses, is immaterial to the operation of triggered device 111. Supposing device 111 to be either an SCR or a triac, when it is triggered into conduction, it sustains itself in conduction until the signal it controls reverses polarity.

The power dissipated in the output amplifier 127 in delivering triggering pulses of a given current level at terminal 107, is lower than that required to deliver the same level of triggering current for sustained periods of time. This reduction is by a factor equal to the reciprocal of the duty cycle of the triggering pulse. For example, with pulses of 10 microsecond duration of 130 microsecond intervals (1/13 duty cycle), the power dissipation can be reduced by a factor of 13. This permits the largest commercially available SCR and triac devices to be triggered directly from an integrated circuit without exceeding the power dissipation limits of an integrated circuit in a conventional 14-lead DIP package or other conventional low-power-level integrated-circuit package.

The integrated-keyed oscillator 100 will not exhibit a dead-zone when $V_{HI\ REF}$ and $V_{LO\ REF}$ are identical potentials. Such function can be accomplished more simply by using a single differential amplifier comparator to provide both SET and RESET signals to the bistable memory element 119, dependent upon whether $V_{IN}$ is positive or negative with respect to a reference potential. Such a circuit may dispense with the bistable memory element 119 and supply its output signal directly to the gate 123. Further, rather than using AND gate 123, the signal from the bistable memory element 119 or from a comparator may be employed directly to control the operation of the relaxation oscillator 121 by controlling the application of operating power thereto, or more generally, by energizing or inhibiting the oscillator, depending on the value of the signal. The alternatives set forth in this paragraph are within the spirit of the present invention and within the scope of certain claims of this application.

Figure 2:
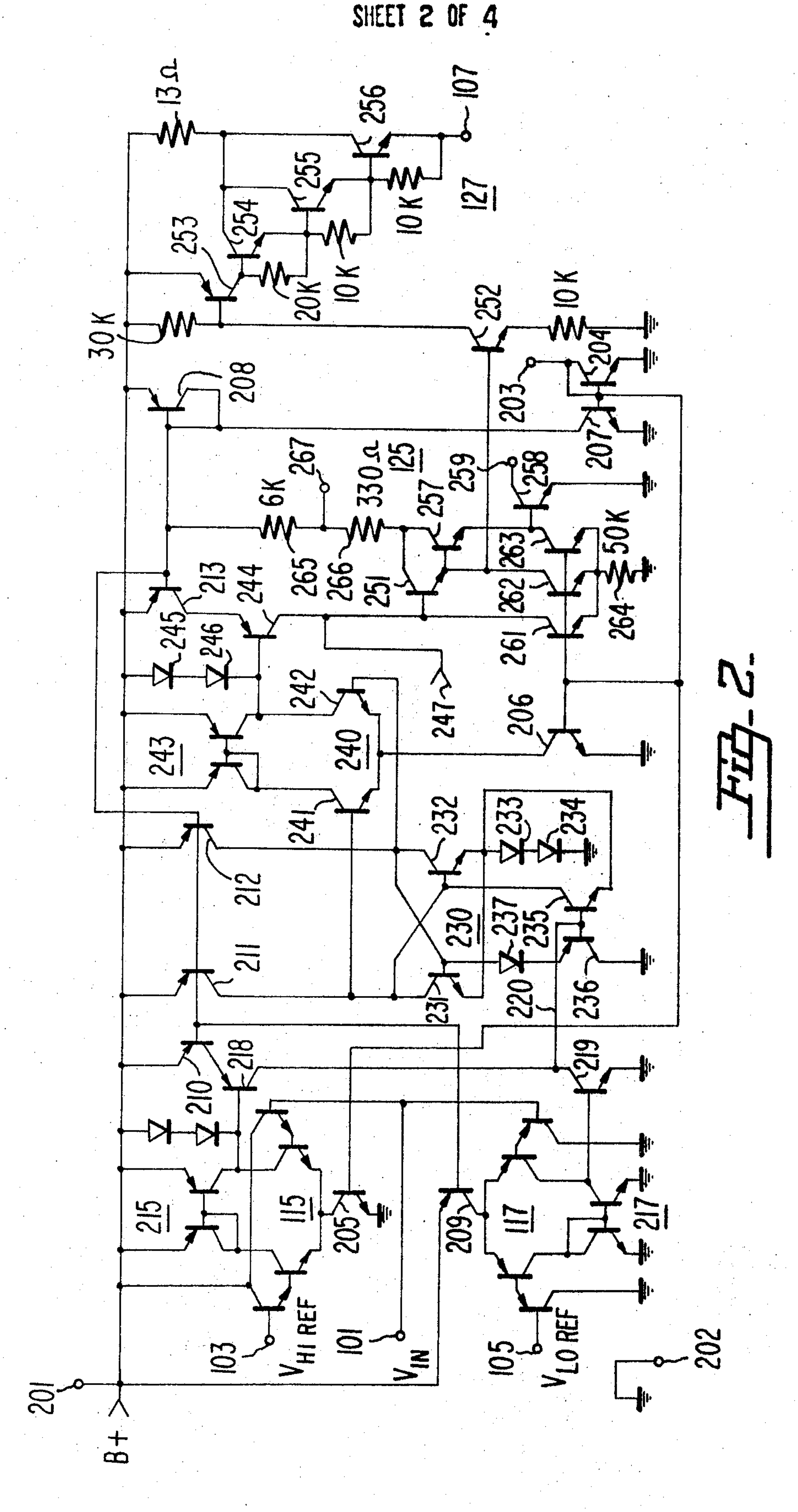
FIG. 2 is a schematic diagram of a voltage comparator and bistable memory element, suitable for use with the present invention.

FIg. 2 shows appropriate circuitry for the dead-zone comparator 113, the AND gate 123, and the driver and output amplifiers 125, 127. The dead-zone comparator circuitry 113 which is summarily described herein is more thoroughly treated in my U.S. patent application Ser. No. 320,634 filed Jan. 2, 1973, entitled "COMPARATOR CIRCUITRY" and assigned like the present application to RCA Corporation.

Terminals 201 and 202 are adapted for receiving operating (B+) and reference (ground) potentials, respectively. A terminal 203 is adapted for receiving a reference current level as may be established by a resistor (not shown) connecting terminals 201 and 203. This reference current level establishes proportionally related levels of collector current in transistors 204, 205, 206, 207, 208, 209, 210, 211, 212, and 213, and in this way governs the constant-current biasing of much of the circuitry in FIG. 2.

The collector current of transistory 205 determines the combined emitter currents of transistors in the differential amplifier 115, which is provided an active balun by the current mirror amplifier 215. The collector current of transistor 209 determines the combined emitter currents of transistors in the differential amplifier 117 which is provided an active balun by the current mirror amplifier 217.

When $V_{IN}$ applied to terminal 101 is positive with respect to $V_{HI\ REF}$ applied to terminal 103, the differential amplifier 115 biases transistor 218 into forward conduction, which when transistor 219 is non-conductive applies a SET signal to buss 220. When $V_{IN}$ is negative with respect to $V_{LO\ REF}$ applied to terminal 105, differential amplifier 117 biases transistor 219 into forward conduction to apply a RESET signal to buss 220.

Flip-flop 230 comprises transistors 231 and 232 which have cross-coupled collector and base electrodes. Transistors 231 and 232 are provided active collector loads from the collector circuits of transistors 211 and 212, respectively. Diodes 233 and 234 establish the emitter electrodes of transistors 231 and 232 at a 1.3 volt potential, approximately.

SET signal appearing on buss 220 biases transistor 235 into conduction, clamping the base electrode of transistor 232 to its emitter electrode. This removes transistor 232 from conduction causing its collector potential to be positive with respect to that of transistor 231, which condition is the stable SET condition of flip-flop 230.

RESET signal appearing on buss 220 biases transistor 236 into conduction clamping its emitter electrode to a 0.65 volt potential, approximately. Diode 237 becomes conductive in this condition clamping the base electrode of transistor 231 to a potential substantially equal to its emitter potential and thus removing transistor 231 from conduction. This causes the collector potential of transistor 231 to be positive with respect to that of transistor 232, which condition is the stable RESET condition of flip-flop 230.

A differential amplifier comparator 240 employs emitter-coupled transistors 241, 242 having their combined emitter currents determined by the collector current of transistor 206. Current mirror amplifier 243 provides active collector loads for transistors 241 and 242 and serves as a balun for the differential amplifier they form. The differential amplifier comparator 240 biases transistor 244 into conduction when and only when flip-flop 230 is biased into its SET condition. Together, flip-flop 230 and differential amplifier comparator 240 provide bistable memory element 119.

Comparator 240 provides a wave-shaping function when $V_{IN}$ is an analog signal and can be omitted from the bistable memory element 119 when $V_{IN}$ is digital in nature. When the collector current of transistor 241 exceeds that of transistor 242, the output transistor of current amplifier 243 is biased into saturation to clamp the base electrode of transistor 244 close to B+ potential and prevent its conduction. Wehn the collector current of transistor 242 exceeds that of transistor 241, diodes 245 and 246 are rendered conductive to clamp the base electrode of transistor 244 about 1.3 volts less positive than B+ potential. Transistor 244 is biased into conduction, its emitter current being limited to that supplied from the collector electrode of transistor 213. The collector current of transistor 244 is also limited, responsive to its emitter current.

Unless the interconnection 247 from the relaxation oscillator 121 (not shown in FIG. 2) presents a low-impedance path to ground reference potential, which it recurrently does, the collector current of transistor 244 will by supplied to the driver amplifier 125—more particularly, to the base electrode of transistor 251. This portion of the circuit functions as the AND gate 123.

Transistor 251 provides a common-collector amplifier for the keyed oscillations supplied to its base electrode. This common-collector amplifier and the common-emitter amplifier employing transistor 252 direct coupled in cascade thereafter comprise the driver amplifier 125. The output amplifier 127 direct coupled in cascade after the driver amplifier 125 comprises in direct-coupled cascade: a common-emitter amplifier using transistor 253 and common-collector amplifiers using transistors 254, 255 and 256, respectively. Output terminal 107 is connected to the emitter electrode of the common-collector amplifier transistor 256, and supplies amplified keyed oscillations suitable for triggering an SCR or triac.

Common-collector amplifier transistor 251 also supplies keyed oscillations to a further common-collector amplifier using transistor 257, which, in turn, supplies amplified keyed oscillations to a grounded emitter amplifier transistor 258. The collector electrode of transistor 258 is connected to terminal 259, from which keyed oscillations complementarily conjugate to those supplied at terminal 107 are available. Terminal 259 may be connected to terminal 107 so that transistor 258 will operate as an active pull-down to discharge capacitance at the emitter of output amplifier transistor 256.

Transistors 261, 262 and 263 have their base electrodes biased by the offset potential developed across the base-emitter junction of transistor 204 in response to the reference current applied to terminal 203. They are provided joint emitter degeneration by resistor 264, and their collector electrodes provide active pull-downs to discharge circuit capacitances. Resistors 265 and 266 regulate the current available in the keyed oscillations supplied at terminal 259, which can be increased by connection of terminals 267 and 201.

Figure 3:
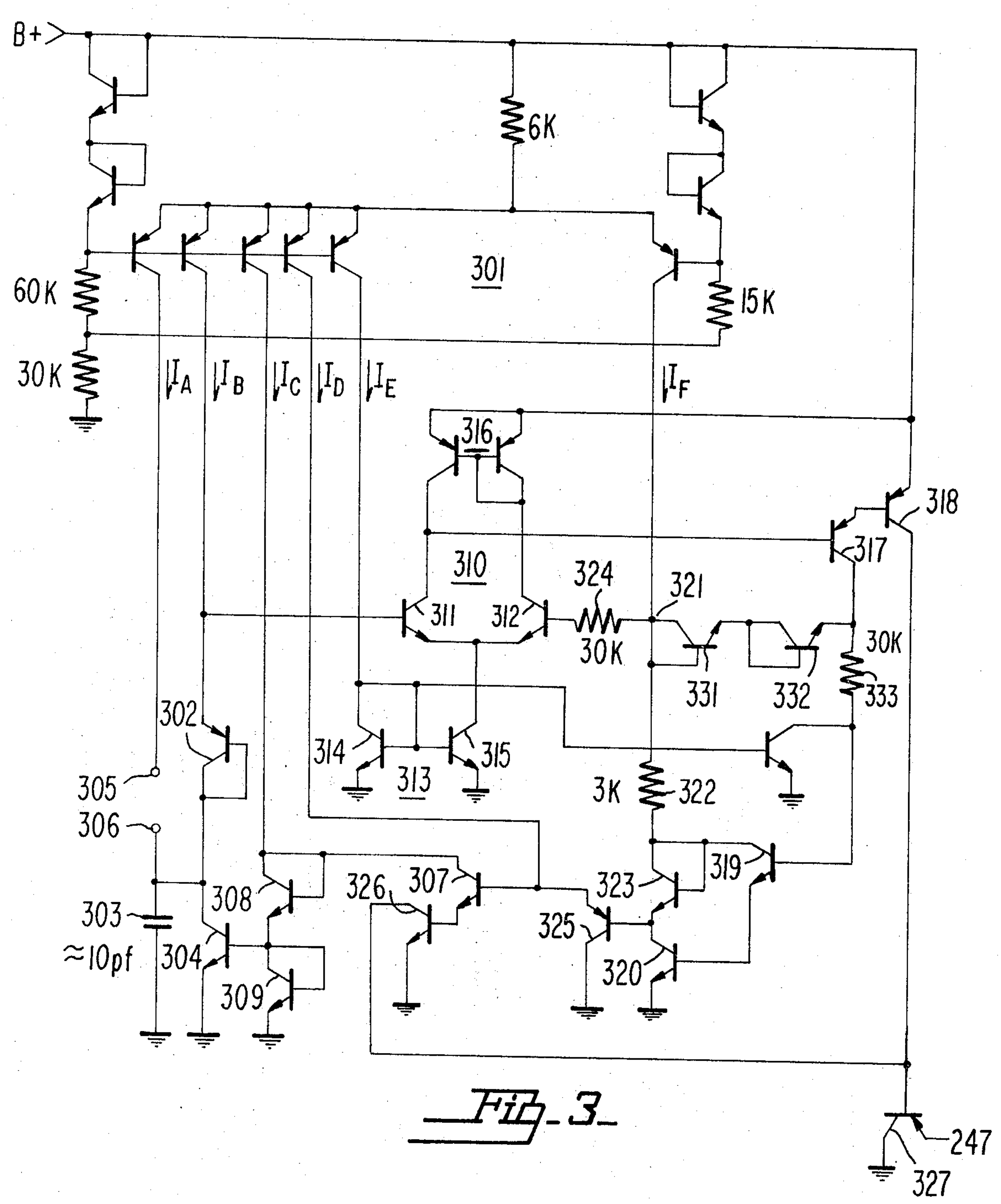
FIG. 3 is a schematic diagram of a relaxation oscillator suitable for use with the present invention.

FIG. 3 shows a realization of the relaxation oscillator 121 suitable for connection to interconnection 247 of FIG. 2. The oscillator is arranged to accept the same operating (B+) potential and reference (ground) potential as the voltage comparator circuitry shown in FIG. 2. The FIG. 3 relaxation oscillator is described in my U.S. Ser. No. 365,840 filed June 1, 1973; entitled "RELAXATION OSCILLATOR" and assigned like the present application to RCA Corporation.

The oscillator 121 has a bias network 301 to provide a plurality of bias currents $I_A$, $I_B$, $I_C$, $I_D$, $I_E$ and $I_F$. $I_F$ is substantially larger than the other currents. $I_B$ is applied via diode-connected transistor 302 to capacitor 303, to place change upon it when transistor 304 is non-conductive. (Current $I_A$ also charges capacitor 303 if terminal 305 be connected to terminal 306 rather than to ground). Whenever transistor 307 is non-conductive, $I_C$ flows through the series connection of diode-connected transistors 308 and 309. An offset potential is thereby developed across the base-emitter junction of transistor 309, which when applied to the base-emitter junction of transistor 304 causes its collector current to be equal to a multiple of $I_C$. The collector current of transistor 304 in such instance, is larger than the current tending to charge the capacitor 303, or $I_B$ or $I_B + I_A$, and the capacitor 303 is discharged.

A differential amplifier 310 uses emitter-coupled transistors 311 and 312. A current mirror amplifier 313 comprises a diode-connected input transistor 314 and an output transistor 315; and its output current, supplied to the joined emitter electrodes of transistors 311 and 312, responds to its input current $I_E$. The differential amplifier 310 uses current mirror amplifier 316 as a balun and as active loads for transistors 311 and 312. The differential amplifier 310 functions as a voltage comparator comparing the potential on capacitor 303, as coupled to the base electrode of transistor 311 via diode-connected transistor 302, with the potential appearing at the base electrode of transistor 312. The potential applied to the base electrode of transistor 312 is responsive to the output signal from the differential amplifier 310, so the comparator characteristic exhibits hysteresis.

Supposing the transistor 307 to be conductive, conducting $I_C$ away from diode-connected transistors 308 and 309 and so rendering transistor 304 non-conductive, the capacitor 303 charges. When the potential across capacitor 303 reaches a sufficient value that the potential at the base electrode of transistor 311 exceeds that at the base electrode of transistor 312, the differential amplifier 310 will bias transistors 317 and 318 into conduction.

The conduction of transistor 317 biases transistor 319 and subsequently transistor 320 into increased conduction. As transistor 320 saturates, the potential at point 321 is pulled closer to ground potential via elements 322 and 323. (The potential drop across resistor 322 is substantially constant, being determined by the flow of the principal portion of $I_F$ therethrough.) As point 321 is pulled closer to ground potential, the potential coupled to the base electrode of transistor 312 via resistor 324 is reduced, providing positive feedback to the comparator formed by differential amplifier 310.

As transistor 320 saturates a transistor 325 is biased into conduction to divert current $I_D$ from the base electrode of transistor 307. This biases transistor 307 out of conduction, permitting $I_C$ to flow to transistors 308 and 309, thereby to cause conduction of transistor 304 and to initiate discharge of capacitor 303. Also, when transistor 307 is biased out of conduction, there is no base current flow to transistor 326, so it too is biased out of conduction.

Transistors 318 and 326 are respectively biased into and out of conduction during the ensuing interval while the capacitor 303 is dischared. The base-emitter junction of transistor 327 is accordingly reverse biased. The transistor 327 is therefore non-conductive during discharge of the capacitor 303. Interconnection 245 can assume whatever potential the subsequent circuitry dictates, and there will be no current flow from the interconnection 245 through transistor 327. Referring back to the FIG. 1 circuit, this means collector current from transistor 244 will flow to the base electrode of transistor 251.

When the capacitor 303 has been discharged sufficiently that the base potential of transistor 311 no longer exceeds that of transistor 312, transistor 312 will become conductive. The collector current of transistor 312 applied to the input circuit of current mirror amplifier 316 will cause its output transistor to saturate, clamping the base electrode of transistor 317 to B+ potential. This biases transistors 317 and 318 out of conduction. A fraction of the current $I_F$ flows via elements 331, 332, 333 and 319 to maintain transistor 320 in reduced conduction. The potential at point 321 rises to place increased forward bias on the base electrode of transistor 312, providing positive feedback to the comparator formed by differential amplifier 310.

As the conduction of transistor 320 is reduced, the base potential of transistor 325 departs from close to ground potential. This reduces the conduction of transistor 325 such that the current $I_D$ flows to the base electrode of transistor 307 to bias transistors 307 and 326 into conduction. The conduction of transistor 307 diverts the current $I_C$ from diode-connected transistors 308, 309 and removes forward bias from the base-emitter junction of transistor 304. Transistor 304 is rendered non-conductive, and capacitor 303 may therefore be recharged.

Since transistor 326 is biased into conduction and transistor 318 is biased out of conduction, the base electrode of transistor 327 is clamped substantially to ground reference potential. The base-emitter junction of transistor 327 provides a low-impedance path to ground reference potential as viewed from the interconnection 245. Referring back to the FIG. 2 circuit, during the charging of the capacitor 303 the collector current of transistor 244 is accordingly diverted from being applied to the base electrode of transistor 251 of the driver amplifier 125. The modulation of the conduction of the transistors 327 by the relaxation oscillations of the relaxation oscillator 121 modulates any collector current flow from transistor 244, which is then amplified in the driver amplifier 125 and the output amplifier 127 to appear at output terminal 107. If transistor 244 provides collector current, which is the case when the input voltage applied when $V_{IN}$ applied to the terminal 101 has been positive with respect to $V_{HI\ REF}$ at terminal 103 and has not subsequently been negative to $V_{LO\ REF}$ at terminal 105, amplified relaxation oscillations will be provided at output terminal 107. In the absence of collector current from transistor 244, which will occur when $V_{IN}$ has been negative with respect to $V_{LO\ REF}$ and has not subsequently been positive with respect to $V_{HI\ REF}$, there will be no current supplied to be amplified by the driver amplifier 125 and the output amplifier 127. Consequently, the relaxation oscillations will not appear at output terminal 107. The results of the comparison of $V_{IN}$ to the reference potentials, $V_{HI\ REF}$ and $V_{LO\ REF}$, keys the appearance of the relaxation oscillations at terminal 107.

Figure 4:
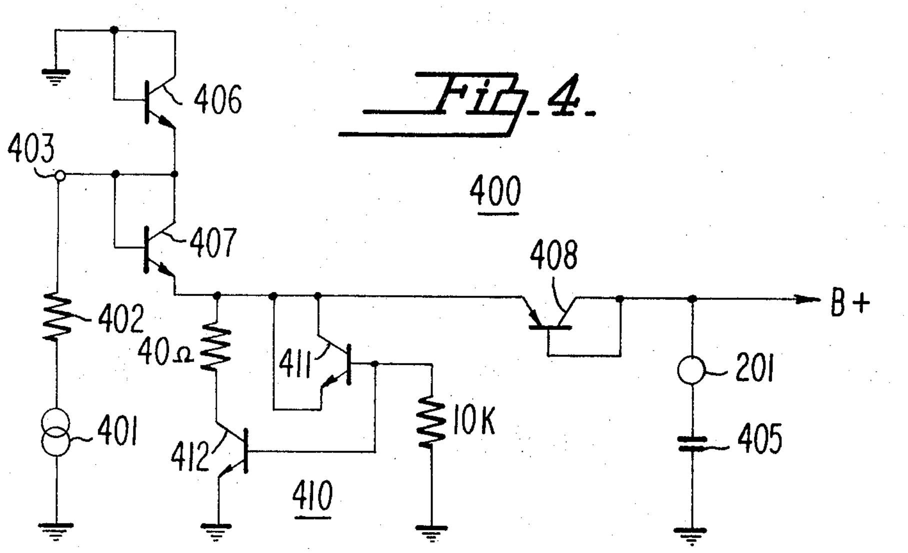
FIG. 4 is a schematic diagram of power supply circuitry suitable for use in certain aspects of the present invention.

FIG. 4 shows rectifying and regulating circuitry 400 which can be included in the integrated comparator-keyed oscillator 100 together with the circuitry shown in FIGS. 2 and 3. A source 401 of a-c power is coupled by a current-limiting resistor 402 to terminal 403 of the integrated circuit 100. A filter capacitor 405 by-passes terminal 201. (Elements 401, 402, and 405 are external to the integrated circuit 100.)

Diode-connected transistor 406 conducts negative excursions of the a-c potential at terminal 403 to ground. Positive excursions of the a-c potential at terminal 403 bias diode-connected transistors 407 and 408 into forward conduction initially to charge filter capacitor 405 and later to sustain its charge. Positive excursions of the a-c signal at the joined emitter electrodes of transistors 407 and 408 are constrained, however, by the limiting circuit 410 to be no larger than a threshold potential equal to the sum of the reverse breakdown of the base-emitter junction of transistor 411 and the offset potential across the forward-conducting base-emitter junction of transistor 412, since for potentials more positive than this threshold potential, transistor 412 becomes strongly conductive. The input terminal 403 is prevented by the clamping action of diode-connected transistor 407 from rising above this threshold potential by more than its base-emitter junction offset potential, so the integrated circuit 100 will not have positive potentials admitted to it sufficiently high to cause damage to its component elements. The limiting circuit 410 also affords substantial regulation of the potential appearing at terminal 201. During negative excursions of the a-c potential at terminal 403, diode-connected transistors 407 and 408 are non-conductive so there is no unwanted path through them for discharging capacitor 405.

When B+ and ground potentials are applied to terminals 201 and 202, rather than the circuitry 400 being used to develop B+ potential, diode-connected transistor 408 not being forward biased prevents the limiting circuitry 410 from exerting any influence upon the regulation of the applied B+ potential. This preventive design is facilitated by making PNP transistor 408 a lateral transistor permits its base-emitter junction to have a higher reverse breakdown potential than that of a vertical structure NPN transistor.

Figure 5:
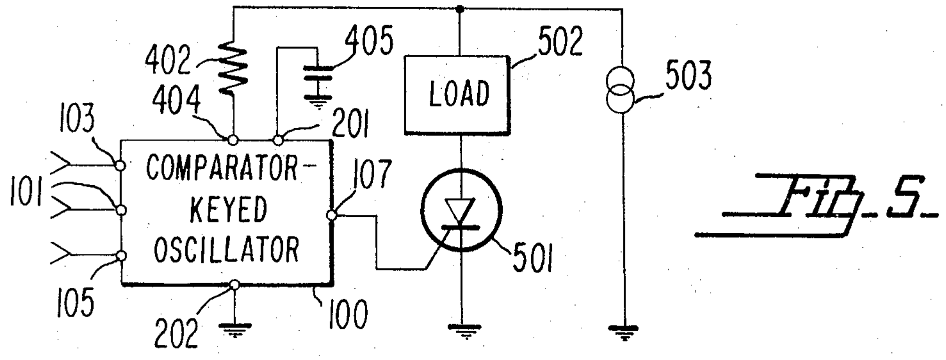
FIGS. 5 and 6 are schematic diagrams showing alternative means of applying triggering signal from the comparator-controlled oscillator circuitry to an ensuing triggerable semiconductor switching device.

FIG. 5 shows the integrated comparator-keyed oscillator 100 supplying triggering pulses from its output terminal 107 which is direct coupled to the gate electrode of an SCR 501. The anode-to-cathode path of SCR 501 is connected in series with a load 502 across a source 503 of a-c power. The source 503 is coupled via resistor 402 to terminal 404 of integrated circuit 100 to provide alternating current to be rectified within the integrated circuit 100. A filter capacitor 405 connects terminal 201 to ground reference potential.

Figure 6:
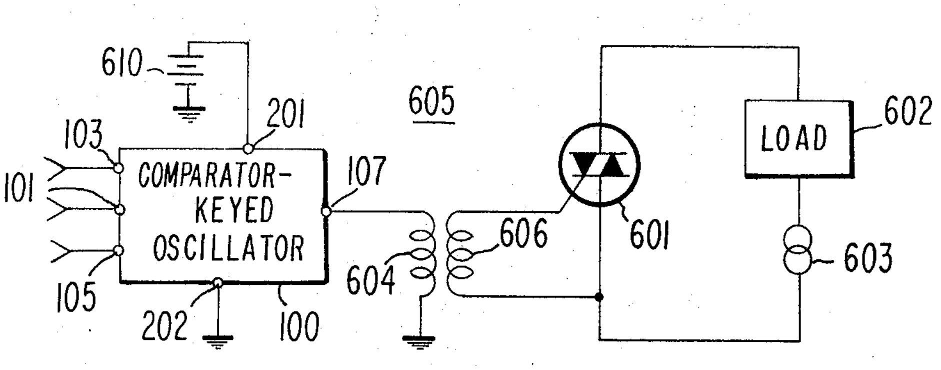

FIG. 6 shows the integrated comparator-keyed oscillator 100 supplying triggering pulses to a triac 601, which has its principal current path serially connected with a load 602 across a source of a-c power 603. The trigger pulses are coupled from the output terminal 107 of integrated circuit 100 to the primary winding 604 of a transformer 605. The secondary winding 606 of transformer 605 is connected between the gate and first main electrodes of triac 601. The transformer 605 typically is a small ferrite-core transformer which provides electrical isolation between the traic 601 and the integrated circuit 100. The transformer provides differentiation of the pulse provided at terminal 107 facilitating a triggering characteristic which does not vary with direction of principal current flow. A source of d-c power 610 is connected between terminals 201 and 202 of integrated circuit 100.

In either of the circuits shown in FIGS. 5 and 6, $V_{HI\ REF}$ and $V_{LO\ REF}$ for application to terminals 103 and 105, respectively, can be developed by a resistive potential divider (not shown) connected between terminals 201 and 202.

What is claimed is:

1. A voltage comparator comprising:

first and second differential amplifiers each having first and second input circuits and an output circuit, said first input circuits of said first and said second differential amplifiers being connected together for receiving an input voltage to be compared to first and second reference voltages applied to their respective said second input circuits;

a bistable memory element having a set circuit and a reset circuit respectively connected to separate ones of the output circuits of said first and said second differential amplifiers, having an output circuit, and being operable to provide at its said output circuit an output signal at one of first and second levels, alternatively available in response to the comparison of said input voltage to said first and said second reference voltages by said first and said second differential amplifiers;

an oscillator having an output circuit from which oscillations are supplied; and an AND gate having a first input circuit connected to receive said memory output signal, having a second input circuit connected to said oscillator output circuit, and having an output circuit for supplying said recurrent pulses.

2. A voltage comparator as claimed in claim 1, further including:

a triggered semiconductor switching device having a triggering circuit coupled to said AND gate output circuit to receive said recurrent pulses, said recurrent pulses serving as trigger pulses for said device.

3. A voltage comparator comprising:

first and second differential amplifiers each having first and second input circuits and an output circuit, said first input circuits of said first and said second differential amplifiers being connected together for receiving an input voltage to be compared to first and second reference voltages applied to their respective said second input circuits;

a bistable memory element having a set circuit and a reset circuit respectively connected to the respective output circuits of said first and said second differential amplifiers, having an output circuit and being operable to provide at its said output circuit an output signal at one of first and second levels, alternatively available in response to the comparison of said input voltage to said first and said second reference voltages by said first and said second differential amplifiers;

means responsive to said memory output signal for supplying recurrent pulses only when said output signal is at said first level; and a triggered semiconductor switching device having a triggering circuit coupled to said means for supplying recurrent pulses to receive said recurrent pulses therefrom and having an output circuit which is enabled to conduct after triggering by the recurrent pulses received by its triggering circuit.

* * * * *